United States Patent
Chen et al.

(10) Patent No.: US 7,053,019 B2
(45) Date of Patent: May 30, 2006

(54) DIELECTRIC MATERIAL COMPOSITIONS WITH HIGH DIELECTRIC CONSTANT AND LOW DIELECTRIC LOSS

(75) Inventors: Li-Mei Chen, Hsinchu (TW); Chao-Jen Wang, Kaohsiung (TW); Chien-Hsien Yu, Miaoli (TW); Jen-Po Lin, Pingtung (TW)

(73) Assignee: Industrial Technology Research Institute (TW)

( * ) Notice: Subject to any disclaimer, the term of this patent is extended or adjusted under 35 U.S.C. 154(b) by 74 days.

(21) Appl. No.: 10/606,859

(22) Filed: Jun. 27, 2003

(65) Prior Publication Data

US 2004/0089853 A1    May 13, 2004

(30) Foreign Application Priority Data

Nov. 8, 2002   (TW) ............................... 91132930 A

(51) Int. Cl.
*C04B 35/468* (2006.01)

(52) U.S. Cl. ...................... 501/137; 501/138; 501/139; 365/149

(58) Field of Classification Search ............... 501/137, 501/138, 139; 423/598; 365/149
See application file for complete search history.

(56) References Cited

U.S. PATENT DOCUMENTS

| | | | | |
|---|---|---|---|---|
| 2,443,211 A | * | 6/1948 | Wainer et al. | 501/137 |
| 4,054,532 A | * | 10/1977 | Hanke et al. | 501/134 |
| 4,115,493 A | * | 9/1978 | Sakabe et al. | 29/25.42 |
| 4,477,581 A | * | 10/1984 | Nishioka et al. | 501/137 |
| 4,994,421 A | * | 2/1991 | Mehrotra | 501/139 |
| 5,017,534 A | * | 5/1991 | Chaput et al. | 501/134 |
| 5,296,425 A | * | 3/1994 | Chazono et al. | 501/138 |
| 5,310,709 A | * | 5/1994 | Wada et al. | 501/134 |
| 5,319,517 A | * | 6/1994 | Nomura et al. | 361/321.4 |
| 5,510,305 A | * | 4/1996 | Sano et al. | 501/138 |
| 5,645,634 A | * | 7/1997 | Ogi et al. | 106/287.19 |
| 5,646,080 A | * | 7/1997 | Chu et al. | 501/137 |
| 5,780,375 A | * | 7/1998 | Drozdyk | 501/137 |
| 5,790,367 A | * | 8/1998 | Mateika et al. | 361/321.4 |
| 5,874,379 A | * | 2/1999 | Joo et al. | 501/138 |
| 6,096,593 A | * | 8/2000 | Joo et al. | 438/238 |
| 6,139,780 A | * | 10/2000 | Desu et al. | 252/584 |
| 6,146,907 A | | 11/2000 | Xiang et al. | |
| 6,277,436 B1 | | 8/2001 | Stauf et al. | |
| 6,429,163 B1 | * | 8/2002 | Kim et al. | 501/137 |
| 6,599,447 B1 | * | 7/2003 | Stauf et al. | 252/520.21 |
| 6,620,753 B1 | * | 9/2003 | Nakamura et al. | 501/137 |
| 6,641,940 B1 | * | 11/2003 | Li et al. | 428/702 |
| 6,660,414 B1 | * | 12/2003 | Xiang et al. | 428/697 |
| 6,829,136 B1 | * | 12/2004 | Nakamura et al. | 361/321.2 |
| 2004/0242403 A1 | * | 12/2004 | Ohsato et al. | 501/139 |

* cited by examiner

*Primary Examiner*—Karl Group
(74) *Attorney, Agent, or Firm*—Sughrue Mion, PLLC

(57) ABSTRACT

A new dielectric material composition with high dielectric constant and low dielectric loss, which includes a quaternary metallic oxide having a pervoskite structure and represented by a general formula, $Ba_{1-x}M^1_x Ti_{1-y}M^2_y O_m$. It is suitable for Gbit memory devices, embedded capacitance devices in multilayered structures, and modulable capacitors for high frequency devices.

12 Claims, No Drawings

DIELECTRIC MATERIAL COMPOSITIONS WITH HIGH DIELECTRIC CONSTANT AND LOW DIELECTRIC LOSS

BACKGROUND OF THE INVENTION

1. Field of the Invention

The present invention relates to a novel dielectric material composition with high dielectric constant and low dielectric loss, which comprises a metal oxide having a pervoskite structure with a general formula $Ba_{1-x}M^1_xTi_{1-y}M^2_yO_m$.

2. Description of the Related Art

Thin-film ferroelectric materials have applications in various electronic devices, such as dynamic and ferroelectric random access memories ("DRAM" and "FRAM"). Thin-film ferroelectric materials are also widely used in the development of new microwave devices such as frequency agile filters, phase shifters, and tunable high-Q resonators. Integrated circuit devices are currently developed toward higher and higher integration densities as well as high frequencies. Therefore, it is important for these devices to have a substantially high capacitance per unit area and, at the same time, possess a high Q factor and modulation capability during operation at high frequencies. Most attention has been focused on $Ba_{1-x}Sr_xTiO_3$ (BST) for this type of application material, as these materials possess high dielectric constants and low loss (that is, high Q factor). BST is a ferroelectric with the pervoskite structure. By the incorporation of $SrTiO_3$, the Curie point of $BaTiO_3$ at 130° C. can be shifted to around room temperature for $Ba_{0.7}Sr_{0.3}TiO_3$, thus achieving the maximum dielectric constant around the operating temperature. At room temperature, single crystal $SrTiO_3$ has a very low loss (tan $\delta < 10^{-4}$) but also a low dielectric constant. On the other hand, $BaTiO_3$ has a very high dielectric constant but a high loss. Mixing Sr and Ba has resulted in BST materials with high dielectric constants and improved tan $\delta$ over $BaTiO_3$. Most investigations are focused on memory devices where measured frequencies range from 1 to several MHz with little discussion on the GHz level. According to the literature, the bulk material of the composition of $Ba_{1-x}Sr_xTiO_3$ has a dielectric constant, $\in_r$, of 300, 760, 990, and 230, and a dielectric loss, tan $\delta$, of 0.5, 0.02, 0.04, and 0.02, measured at 20° C. and a frequency of 1 GHz when x is 0, 0.44, 0.38, and 1, respectively. The dielectric loss still has room for improvement. In view of the potential for more stringent requirements for materials in the future due to the operation of the devices at a frequency of several GHz and at a raised temperature resulting from device integration, the improvement of electric and frequency properties for BST is needed.

The important properties of dielectric materials, for example, dielectric constant and dielectric loss, often vary as temperature or frequency varies. Thus the operation range for application varies accordingly. Furthermore, the improvement of one property (such as, dielectric constant) always causes other properties (such as, dielectric loss) to deteriorate.

U.S. Pat. No. 6,146,907 discloses a dielectric thin film having a general formula, $(Ba_xSr_yCa_{1-x-y})TiO_3$. U.S. Pat. No. 6,277,436 discloses a dielectric material, comprising a metal titanate film composed of at least 60 atom % titanium, $(Zr,Sn)TiO_4$, $Zr_{1-x}Sn_xTiO_4$, and the oxide of $(Ba_xSr_yTi_{1-x-y})$. The metal oxides mentioned above are different from $Ba_{1-x}M^1_xTi_{1-y}M^2_yO_m$ of the present invention.

SUMMARY OF THE INVENTION

Accordingly, an object of the invention is to provide a novel dielectric material composition with high dielectric constant and low dielectric loss.

The metal oxide in the present dielectric material composition has a structure of $BM^1TM^2O$, which is a quaternary metallic oxide, developed from BSTO, a tertiary metallic oxide. This is a unique innovation. Such dielectric material composition possesses both high dielectric constant and low loss and thus is suitable for Gbit memory devices, embedded capacitance devices in multilayered structures, and tunable capacitors for high frequency devices.

The present dielectric material composition can be utilized in the form of ceramic bulk or thin film.

Compared to the disadvantages of the current materials, the present dielectric material composition possesses a high dielectric constant and a low dielectric loss. The applicable operation range (corresponding to the peak value) for the present composition is broadened due to the adjustment of the structure through the introduction of other elements into BST, while the present composition is allowed to simultaneously have a high dielectric constant and a low dielectric loss. This is very important to the GHz high frequency and Gbit devices.

DETAILED DESCRIPTION OF THE INVENTION

The present dielectric material composition with high dielectric constant and low dielectric loss comprises a metal oxide of a general formula, $Ba_{1-x}M^1_xTi_{1-y}M^2_yO_m$. The metal oxide is obtained mainly by means of adjusting the structure of the oxide, BaSrTiO. According to the theory of valence change and the principle of electrical neutrality, $M^1$ may be a metal selected from the group consisting of the elements of Groups IA and IIA of the periodic table lanthanide series, Zn, Bi, and Sn. Among them, $M^1$ is preferably Mg, La, or Sr, and more preferably Sr or La. $M^2$ may be a metal selected from the group consisting of Ta, Zr, Ce, Nb, Co, and Hf. Among them, $M^2$ is preferably Ta, Zr, or Hf, and more preferably Ta or Zr. The valences of La and Nb are 3. The valence of Zn is 2. The valence of Bi may be 3 or 5. The valence of Sn may be 2 or 4. The valence of Ta is 5. The valences of Zr and Hf are 4. The valence of Ce may be 3 or 4. The valence of Co may be 2 or 3. x is a number of 0 to 1, and preferably 0 to 0.5, provided that x is not 0. y is a number of 0 to 1, and preferably 0 to 0.5, provided that y is not 0. The value of m is available according to the valence of $M^1$ and $M^2$ and the principle of electrical neutrality for the metal oxide, satisfying the equation, $2(1-x)+v^1x+4(1-y)+v^2y-2m=0$, wherein $v^1$ is the valence of $M^1$, and $v^2$ is the valence of $M^2$.

A feature of the present invention is that the dielectric material composition possesses good dielectric properties, even at the proximity of phase transition. Especially, the mechanism of dielectric loss at the proximity of phase transition includes interior friction loss, structural distortion lose, defect polarization loss, domain wall displacement loss within the structure, and interactions among different mechanisms. In order to alter the oxygen vacancies, metal atoms having different valences are introduced, It is reported in literatures that polarization fatigue and electric leakage are greatly related to the accumulation of oxygen vacancies between the thin film and the electrode or in the interior of the thin film. Additionally, oxygen vacancies also result in local structure distortion and damage, and this, in turn, results in the accumulation of electric charges within the thin film; therefore the dielectric properties are altered. Furthermore, the radius of the new metal ion which replaces the centered or corner original metal ion is different from the original metal ion, resulting in the distortion of the structure, and thus the related properties are altered. A multi-metal oxide formed by the addition of a metal ion having a relatively lower valence in the original structure is known as "acceptor type". The resulting defects of oxygen vacancies very easily diffuse even at a temperature less than Curie temperature. The defect polarization from such oxygen vacancies and $M^2$ alters the dielectric properties. A multi-metal oxide formed by the addition of metal ions having relatively higher valence in the original structure is known as "donor type". There are increased metal atom vacancies in the structure. The resulting defect polarization also alters the dielectric properties. The move for metal atom vacancies is more difficult than the move for oxygen vacancies; thus the metal atom vacancies and the oxygen vacancies possess different influences on dielectric properties. The above described concept is utilized in the present invention to find a quaternary metallic oxide for improving the dielectric properties. The function of $M^1$ is mainly the adjustment in dielectric constants within the interval of phase transition, whereas the function of $M^2$ is the adjustment in dielectric loss mechanism. Of course, there is an interaction between the two functions, and an optimal situation must be determined.

The preferred examples for the present metal oxide in the dielectric material composition with high dielectric constant and low dielectric loss are $(Ba_{1-x}La_x)(Ti_{1-y}Hf_y)O_3$ (wherein, $0<x\leq0.5$, and $0<y\leq0.5$), $(Ba_{1-x}La_x)(Ti_{1-y}Zr_y)O_3$ (wherein, $0<x\leq0.5$, and $0<y\leq0.5$), and $((Ba_{1-x}Sr_x))(Ti_{1-y}Ta_y)O_3$ (wherein, $0.3\leq x\leq0.5$, $0<y\leq0.3$).

The present dielectric material composition has a high dielectric constant and a low dielectric loss. At high frequency (GHz), the dielectric constant may attain more than 320, preferably more than 950, and up to 1000. At high frequency (GHz), the dielectric loss may be less than 0.01, preferably leas than 0.001, and down to 0.0005. Therefore, the present dielectric material composition is well suited for devices operated at high frequency.

The present dielectric material composition can be prepared by means of solid state reactions or liquid phase reactions.

The suitable methods of solid state reactions can be exemplified by (but are not limited to) cofire ceramic, magnetron sputtering, and ion beam plating. The useful starting materials may be corresponding single metallic oxides, such as powder or a target material of BaO, SrO, and $TiO_2$; the corresponding fluoride, such as powder or a target material of $BaF_2$, $SrF_2$, and $TiF_4$; or the corresponding single component of metal targets. The follow-up calcination is accomplished in an atmosphere of oxygen, in order to form the oxide. When the metal oxide in the present invention is prepared from a solid state reaction, the calcination temperature for forming the form of the bulk material may be 900~1100° C., and the sintering temperature may be 1200~1300° C. For forming the form of the thin film, 600~800° C. of temperature is used.

Suitable methods of liquid phase reaction are exemplified by (but are not limited to) sol-gel method, co-precipitation method, spray method, and hydrothermal method. Useful starting materials may be the alkoxides, carbonates, nitrates, acetates, acetylacetonates, or chlorides of the corresponding singly metal element, such as $Ti(OC_4H_9)_4$, strontium acetate, and barium acetate. When the metal oxide in the present invention is prepared from a liquid phase reaction, the process temperature may be further reduced to less than 550° C.

The process temperature for solid state reactions is relatively high, because the sufficient energy is demanded for accomplishing the heat diffusion of the different atoms from more than 4 components to form a uniform component structure; nevertheless, in case of using a method of liquid phase reactions, as long as appropriate precursors have been selected, material having a multi-component distribution can be synthesized at a time with an array reactor. Additionally, because the admixture in a molecular order is much more uniform than in a Solid state reaction, the process temperature to form powder or thin films is reduced.

EXAMPLES

Example 1

Preparation of BSTT Type Quaternary Metallic Oxide Dielectric Material

The preparation of metal oxide dielectric material film of formula $(Ba_{1-x}Sr_x)(Ti_{1-y}Ta_y)O_3$, $0.3\leq x\leq0.5$, $0\leq y\leq0.3$, was performed by an ion-beam sputtering system. The starting materials were the corresponding single component metal targets. Beam current was 40~60 mA. The substrate was $LaAlO_3$. After sputtering each metal target for specific time according to the desired stoichiometry and deposition rate, an annealing treatment for heat diffusion at 400° C. in an atmosphere of oxygen was performed. Then, the resultant was annealed for 24 hrs in a tube with a flow of oxygen, followed by a thermal treatment for crystallization at more than 1000° C. The dielectric constant and dielectric loss of the resulting metal oxide thin film were measured by a dielectric constant meter at 2.5 GHz.

For a BST system, the phase transition always takes place at the interval of x in the formula being approximately 0.4. At such an interval, the dielectric constant is the highest, and the dielectric loss is also the highest.

Therefore, in this example, the ratio of y was adjusted with x being fixed at 0.4, in order to improve the dielectric loss. It was found that when y was zero, the dielectric constant was high and up to 600, but the dielectric loss was also high and up to 0.4. The dielectric constant decreased gradually to about 200 and the dielectric loss decreased to less than 0.001 as y increased. It happened that the point of y being approximately 0.02 was the border of the most dramatic change for the dielectric constant and dielectric loss. At that point, the dielectric constant and dielectric loss changed most dramatically.

Example 2

Preparation of BLTF Type Quaternary Metallic Oxide Dielectric Material

The preparation of metal oxide dielectric material film of formula $(Ba_{1-x}La_x)(Ti_{1-y}Hf_y)O_3$, $0\leq x$, $y\leq0.5$, was performed by an ion-beam sputtering system. The starting materials were the corresponding single component metal targets. Beam current was 40~60 mA. The substrate was $LaAlO_3$. After sputtering each metal target for specific time according to the desired stoichiometry and deposition rate, an annealing treatment for heat diffusion at 400° C. in an atmosphere of oxygen was performed. Then, the resultant was annealed for 24 hrs in a tube with a flow of oxygen, followed by a thermal treatment for crystallization at more than 1000° C. The dielectric constant and dielectric loss of the resulting metal oxide thin film were measured by a dielectric constant meter at 2.5 GHz.

The results showed that, in the rectangular area formed by $0.03<x<0.35$ and $0.008<y<0.36$, the dielectric constant was more than 320 and the dielectric loss was less than 0.01. In such an area, the dielectric constant could be high and up to 650 and dielectric lose less than 0.001.

Example 3

Preparation of BLTZ Type Quaternary Metallic Oxide Dielectric Material

The preparation of metal oxide dielectric material film of formula $(Ba_{1-x}La_x)(Ti_{1-y}Zr_y)O_3$, $0 \leq x, y \leq 0.5$, was performed by an ion-beam sputtering system. The starting materials were the corresponding single component metal targets. Beam current was 40~60 mA. The substrate was $LaAlO_3$. After sputtering each metal target for specific time according to the desired stoichiometry and deposition rate, an annealing treatment for heat diffusion at 400° C. in an atmosphere of oxygen was performed. Then, the resultant was annealed for 24 hrs in a tube with a flow of oxygen, followed by a thermal treatment for crystallization at more than 1000° C. The dielectric constant and dielectric loss of the resulting metal oxide thin film were measured by a dielectric constant meter at 2.5 GHz.

The results showed that, in two areas defined by [(0.01, 0.02), (0.01,0.31), (0.15,0.02), (0.1,0.31)] and [(0.32,0), (0.5,0), (0.5,0.31)], according to the (x, y) coordinate system, all the dielectric constants were more than 530 and all the dielectric losses were less than 0.01. The preferred result was that the dielectric constant was high and up to 950 and the dielectric loss was less than 0.005.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
a dielectric film comprising a quaternary metal oxide having a formula of:

$$Ba_{1-x}M^1_xTi_{1-y}M^2_yO_m,$$

wherein

M$^1$ is a metal selected from the group consisting of the elements of Group IA and IIA of the period table, lanthanide series, Zn, Bi, and Sn;

M$^2$ is Hf;

$0 < x, y < 1$; and m satisfies the principle of electrical neutrality for the metal oxide, wherein the dielectric constant of the dielectric film is more than 320 and the dielectric loss is less than 0.01 at 2.5 GHz.

2. The memory device as claimed in claim 1, wherein M$^1$ is Mg, La, or Sr.

3. The memory device as claimed in claim 2, wherein M$^1$ is Sr or La.

4. The memory device as claimed in claim 1, wherein $0<x \leq 0.5$.

5. The memory device as claimed in claim 1, wherein $0<y \leq 0.5$.

6. The memory device as claimed in claim 1, wherein the metal oxide is $(Ba_{1-x}La_x)(Ti_{1-y}Hf_y)O_3$, $0<x \leq 0.5$ and $0<y \leq 0.5$.

7. The memory device as claimed in claim 1, wherein the dielectric film with high dielectric constant and low dielectric loss is manufactured from a method of solid state reaction.

8. The memory device as claimed in claim 1, wherein the dielectric film with high dielectric constant and low dielectric loss is manufactured from a method of liquid phase reaction.

9. The memory device as claimed in claim 1, wherein the dielectric constant of the dielectric film is more than 950 and the dielectric loss is less than 0.001 at 2.5 GHz.

10. The memory device as claimed in claim 1, which is a Gbit memory device.

11. A memory device, comprising:
a dielectric film comprising a quaternary metal oxide having a formula of:

$$(Ba_{1-x}La_x)(Ti_{1-y}Zr_y)O_3,$$

where $0.3 \leq x \leq 0.5$ and $0<y \leq 0.3$, wherein the dielectric constant of the dielectric film is more than 320 and the dielectric loss is less than 0.01 at 2.5 GHz.

12. A memory device, comprising:
a dielectric film comprising a quaternary metal oxide having a formula of:

$$(Ba_{1-x}La_x)(Ti_{1-y}Zr_y)O_3,$$

where $0<x \leq 0.5$, and $0<y \leq 0.5$, wherein the dielectric constant of the dielectric film is more than 320 and the dielectric loss is less than 0.01 at 2.5 GHz.

* * * * *